(12) United States Patent
Pfeuffer et al.

(10) Patent No.: US 10,804,433 B2
(45) Date of Patent: Oct. 13, 2020

(54) OPTOELECTRONIC DEVICE AND METHOD

(71) Applicant: OSRAM OLED GmbH, Regensburg (DE)

(72) Inventors: Alexander F. Pfeuffer, Regensburg (DE); Sophia Huppmann, Geldersheim (DE); Andrea Winnerl, Regensburg (DE); Jens Müller, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/256,897

(22) Filed: Jan. 24, 2019

(65) Prior Publication Data
US 2019/0229240 A1    Jul. 25, 2019

(30) Foreign Application Priority Data

Jan. 24, 2018   (DK) ................................ 2018 70048

(51) Int. Cl.
*H01L 33/38*   (2010.01)
*H01L 33/62*   (2010.01)
(Continued)

(52) U.S. Cl.
CPC ............ *H01L 33/382* (2013.01); *H01L 27/15* (2013.01); *H01L 33/005* (2013.01); *H01L 33/22* (2013.01);
(Continued)

(58) Field of Classification Search
None
See application file for complete search history.

(56) References Cited

U.S. PATENT DOCUMENTS

2011/0136271 A1* 6/2011 von Malm .......... H01L 33/0093
438/15
2011/0260184 A1   10/2011 Furuyama
(Continued)

FOREIGN PATENT DOCUMENTS

JP   2011233650 A   11/2011
JP   2015501085 A    1/2015
(Continued)

*Primary Examiner* — Evren Seven
(74) *Attorney, Agent, or Firm* — Slater Matsil, LLP

(57) ABSTRACT

An optoelectronic device and a method are disclosed. In an embodiment an optoelectronic device includes a semiconductor body having a layer sequence with an active region configured to generate radiation, a first dielectric layer arranged on the layer sequence having a plurality of first areas and a second area, a first contact via in each area of the plurality of first areas for contacting a first side of the active region, a second contact via in the second area for contacting a second side of the active region and a conductive layer comprising a plurality of first regions and a second region surrounding the plurality of first regions and electrically isolated from the plurality of first regions, the conductive layer having a substantially planar surface and being arranged planar onto the plurality of first areas and the second area such that each of the plurality of first regions of the conductive layer is in contact with the first contact via in the respective area of the plurality of first areas and the second region of the conductive layer is in contact with the second contact via of the first dielectric layer.

15 Claims, 9 Drawing Sheets

(51) Int. Cl.
*H01L 33/22* (2010.01)
*H01L 27/15* (2006.01)
*H01L 33/00* (2010.01)

(52) U.S. Cl.
CPC ...... *H01L 33/62* (2013.01); *H01L 2933/0016* (2013.01)

(56) References Cited

U.S. PATENT DOCUMENTS

| | | | |
|---|---|---|---|
| 2013/0187192 A1* | 7/2013 | Hoeppel | H01L 31/18 257/99 |
| 2014/0061703 A1* | 3/2014 | Von Malm | H01L 31/02019 257/98 |
| 2015/0318444 A1* | 11/2015 | Huang | H01L 33/62 257/99 |
| 2016/0336307 A1* | 11/2016 | Herrmann | H01L 33/62 |
| 2017/0352700 A1 | 12/2017 | von Malm | |
| 2018/0315738 A1* | 11/2018 | Bono | H01L 25/0753 |
| 2018/0331251 A1 | 11/2018 | Scholz et al. | |
| 2019/0013351 A1 | 1/2019 | Pfeuffer | |
| 2019/0273184 A1* | 9/2019 | Wei | H01L 33/387 |

FOREIGN PATENT DOCUMENTS

| | | |
|---|---|---|
| KR | 20120004876 A | 1/2012 |
| WO | 2015053600 A1 | 4/2015 |
| WO | 2017068029 A1 | 4/2017 |
| WO | 2017081085 A1 | 5/2017 |
| WO | 2017121659 A1 | 7/2017 |

\* cited by examiner

OPTOELECTRONIC DEVICE AND METHOD

CROSS-REFERENCE TO RELATED APPLICATIONS

This application claims the benefit of Danish patent application DK PA201870048, filed on Jan. 24, 2018, which application is hereby incorporated herein by reference.

TECHNICAL FIELD

The invention relates to an optoelectronic device and a method for manufacturing the same.

BACKGROUND

Optoelectronic devices are nowadays used for a variety of different lighting applications. Customers and applications demand that the devices are flexible with respect to its lighting characteristics. Optoelectronic devices should be able to provide a controllable lighting characteristics and strength suitable for instance in automotive or household appliances. Hence, there is a demand for improved optoelectronic devices and method for manufacturing the same.

Semiconductor devices of various known types are found in International Publication No. WO 2017/121659, in International Publication No. WO 2015/053600, in Korean Publication No. KR20120004876 and in U.S. Publication No. 2016/0336307.

SUMMARY

Embodiments provide an optoelectronic device comprising a semiconductor body having a layer sequence with an active region provided for generating radiation. The device comprises a first dielectric layer arranged on the layer sequence having a plurality of first areas and a second area. A first contact via in each area of the plurality of first areas is provided for contacting a first side of the active region. Likewise at least one second contact via in the second area is provided for contacting a second side of the active region. A conductive layer is arranged onto the plurality of first areas and the at least one second area with a substantially planar, that is flat surface. The conductive layer comprises a plurality of first regions and a second region. The second region surrounds the plurality of first regions and is electrically isolated from the plurality of first regions. Each of the plurality of first regions of the conductive layer is in contact with a respective first contact via in the respective area of the plurality of first areas. The at least one second region of the conductive layer is in contact with the at least one second contact via of the first dielectric layer.

According to embodiments, the conductive layer is formed as a single layer arranged over the dielectric layer. Such approach reduces the surface topology of the conductive layer, which would be otherwise caused due to different processing steps of the respective contact via. As a result, the reduce topology will significantly improve the properties for direct bonding of the device and reduce the risk of delamination after the direct bonding process. Further issues related to TSV (through silicon via) contacting the respective portions in subsequent steps are prevented or reduced.

Another aspect concerns the current distribution. A current distribution layer may be deposited onto the active region and is in contact with the first contact via in each area of the plurality of first areas. The current distribution layer may comprise ITO or another conductive material, suitable to distribute charge carriers across the active region. To further enhance the current distribution, the first contact via in each area of the plurality of first areas in the first dielectric layer may comprise different shapes. It can have some form of closed shape, i.e., a rectangle, hexagon, rhombus, polygon. Alternatively, the contact via can be circular shape. Several first contact via can be arranged in certain relation to each other.

In this regard, first contact via in each area of the plurality of first areas may be filled with a conductive material. Such material can be different from the material of the conductive layer. The conductive material in the first contact via in each area is recessed with respect to the surface of the first dielectric layer. It does therefore not completely fill the contact via. Hence, the conductive layer may extend partly into the contact via. Such recess in the contact via will prevent the formation of a protrusion when the conductive layer is deposited.

In some cases the conductive material may be slightly recessed on its surface in an area over the second contact via. Hence, in some aspects the optoelectronic device comprises a filling material in areas of the conductive layer over the at least one second contact via such that the conductive layer with the filling material forms the planar and substantially flat surface.

While the first contact via may contact the distribution layer and/or the first side of the active region, the second contact via in the second area may extend through the layer sequence with the active region. To prevent a short circuit it comprises a dielectric layer arranged on its sidewall.

To prevent short circuit in the conductive layer, the conductive layer comprises one or more insulation recesses electrically isolating the first regions from the second region. The insulation recesses extends from the first dielectric layer to the upper surface of the conductive layer and is filled with a dielectric and insulating material. Each insulation recess surrounds one of the first regions, such that contacts to the first contact via of the first dielectric layer are inside the respective first region. The insulation recess can be of any suitable shape, including a round or polygon shape, like rectangle or hexagonal and the like.

In various embodiments, the optoelectronic device may further comprise a second dielectric layer arranged planar onto the conductive layer. The second dielectric layer may comprise a plurality of first contact via. Each contact via of the plurality of first contact via contacts a corresponding first region of the conductive layer, such that each contact via is displaced with respect to a virtual extension of the first contact via in each area of the plurality of first areas.

Likewise, the second dielectric layer can comprise at least one second contact via in the second dielectric layer contacting the second region of the conductive layer, such that second contact via is displaced with respect to a virtual extension of the second contact via in the second area.

The displacement may further reduce the risk of delamination between the contact via in the second dielectric layer and the respective portion of the surface of the conductive layer. In other words, any remaining uneven surface portion, glitches in the surface or lattice displacements due to the processing of the contact via in the first dielectric layer, which may be covered by the conductive layer but may continue through such layer does not affect the bonding. This is achieved to a large extent by the already planar and flat surface and further supported by the displacement.

The proposed structure allows a segmentation of an optoelectronic device into a plurality of sections. Each section is contacted via the one of the first contact via and the at least one second contact via acting a common contact via. The segments of the optoelectronic device can therefore be individually supplied with current.

In various other embodiments, the second dielectric layer of the optoelectronic device may comprise a body layer, sandwiched between two dielectric layers. One of the dielectric layer facing the conductive layer acts as a bonding layer. The body layer may comprise a semiconductor or a conductive material. For example, the body layer may comprise silicon. Accordingly, the plurality of first contact via and the at least one second contact via are formed as TSV contacts (through silicon via). The second dielectric layer may be thick enough to provide the necessary stability for the optoelectronic device for further processing.

In yet other embodiments, one or more soldering layer bumps can be arranged on each of the plurality of first contact via of the second dielectric layer and/or on the second contact via of the second dielectric layer. The one or more soldering layer bumps can extend at least partly onto the second dielectric layer. The solder bumps may comprise one or more layers to ensure a rigid and tight connection to the respective contact via. Extending the solder bumps beyond the contact via provide a better accessibility and a larger contact area. Contacting errors due to mismatch when soldered to another circuit are large localized current densities are reduced.

In further embodiments, the TSV contact via, or generally the plurality of first contact via and the at least one second contact via in the second dielectric layer can comprise a dielectric layer arranged on its respective sidewalls. Optionally, a conducting material can be deposited on the dielectric sidewall layer in the recess forming the via, the conducting layer contacts the conductive layer. The remaining space of the plurality of first contact via and the at least one second contact via in the second dielectric layer can be filled with a conductive material, for instance a metal, or a doped semiconductor. In some aspects, the conducting material deposited on the dielectric sidewall of the via can be of the same material as a layer of the soldering bumps.

In yet further embodiments, the optoelectronic device may comprise a tension reduction layer arranged between the conduction layer and the second dielectric layer. Such layer is used to reduce lattice stress or displacements, which may occur when two different semiconductor material are bonded together. Tension reduction layers are also useful to compensate different thermal expansion coefficients.

In embodiments, the optoelectronic device may further comprise a structuring on a surface of the semiconductor body opposite the first dielectric layer. Such structuring may be arranged at least over a virtual extension of the plurality of first areas towards the surface of the semiconductor body, the structuring preferably having a substantially flat surface. The structuring is arranged over the active zone and the area, and reduces back reflection of light back into the semiconductor body. The structuring can comprise a dielectric layer applied onto a roughened surface of the semiconductor body.

For further improvement of light direction and to reduce crosstalk, the optoelectronic device may also comprise one or more structures on the surface of the semiconductor body and/or the structuring. The one or more structures are arranged at least partly over a virtual extension of the second area. As second areas separate different segments of an optoelectronic device from each other, the one or more structures prevent cross talk between light being transmitted from different segments. The structures can be made of different materials, e.g., silicon or metal. In one aspect the structures are formed such that they are suitable to act as auxiliary carrier during several processing steps of the optoelectronic device. In some other aspects the original carrier, upon which the semiconductor body is deposited upon during manufacturing, can be structured.

Various embodiments relate to a method for obtaining an optoelectronic device. The method comprises the steps of: providing a semiconductor body having a layer sequence with an active region provided for generating radiation; depositing a first dielectric layer on the layer sequence having a plurality of first areas and a second area; providing a first contact via in each area of the plurality of first areas for contacting a first side of the active region; providing a second contact via in the second area for contacting a second side of the active region; depositing a conductive layer with a substantially planar surface and arranged planar onto the plurality of first and second areas of the first dielectric layer, the conductive layer comprising a plurality of first regions and a second region surrounding the plurality of first regions and electrically isolated from the plurality of first regions such that each of the plurality of first regions of the conductive layer is in contact with the first contact via in the respective area of the plurality of first areas and the second region of the conductive layer is in contact with the second contact via of the first dielectric layer.

The proposed manufacturing process may provide a conductive layer as a single flat and planar layer arranged over the dielectric layers. In particular, surface irregularities, like bumps and the like caused by different processing steps are reduced. The flat surface of the conductive layer enables an easier subsequent processing reducing the risk of delamination. Contacting using TSV processes are simplified.

In an embodiment of the method, wherein providing a first contact via in each area comprises and etching step, namely etching the first contact recess in the first dielectric layer until the active region is reached. Then a conductive material is deposited. Such material may comprise a metal or highly conductive material inside the etched first contact recess leaving a recess between an upper surface of the conductive material and an upper surface of the first dielectric layer. Leaving a recess will reduce the likelihood of a protrusion on the surface of a subsequently deposited layer. The conductive material deposited in the first contact via may be different from the conductive material. As a result of the recess left behind in the first contact via, subsequently depositing the conductive material will completely fill the first contact via.

Likewise the second contact via is provided by etching a second recess in the second area and extending through the layer sequence with the active region. A dielectric material is then deposited on sidewalls of the etched recess to electrically insulate the various layers from conductive material filled subsequently into the recess. The conductive material might be metal and can be the same as the material of the conductive layer.

In another embodiment, a current distribution layer is deposited onto the active region prior to depositing the first dielectric layer. The current distribution layer is in contact with the first contact via of a respective one of the plurality of first areas.

Processing the conductive layer further may comprise depositing material forming the conductive layer; etching an insulation recess into the conductive area forming a first region thereby electrically isolating the first region from a surrounding second region of the conductive layer; and filling the insulation recess with a dielectric material. The insulation recess extends through the conductive layer. The insulation recess may have different shapes and can surround an area of conductive material forming the first region. It may happen that the conductive layer is not totally even over the second contact via. Hence, a material can be additionally filled into the uneven spots, such that the conductive layer with the filling material forms a planar and substantially flat surface.

In another embodiment of the method, a second dielectric layer is arranged planar onto the conductive layer. A plurality of first contact via is formed wherein each contact via of the plurality of first contact via is formed over and contacts a corresponding first region of the conductive layer. Each contact via is displaced with respect to a virtual extension of the first contact via in each area of the plurality of first areas. The first contact via is therefore not located above a contact via in the first dielectric layer or the conductive layer.

For this purpose, a plurality of recesses is etched in the second dielectric layer till the first region. Then a dielectric layer is deposited on the sidewalls of the plurality of recesses; and the plurality of recesses is filled with a conductive material to form the plurality of first contact via.

Likewise at least one second contact via may be arranged in the second dielectric layer. Each second contact via is formed over and contacts a corresponding second region of the conductive layer. Each second contact via is displaced with respect to a virtual extension of the second contact via in the second areas.

In some embodiments, at least one second recess may be etched in the second dielectric layer till the second region of the conductive layer is reached. The least one second recess is displaced with respect to a virtual extension of the second contact via in the second area. Then a dielectric layer is deposited on the sidewall of the at least one recess. A conductive material is filled into the at least one second recess to form at least one second contact via in the second dielectric layer. According to such aspects, first and second contacts via through the second dielectric layer are therefore displaced with respect to respective contact via in the first dielectric layer.

In further embodiments, a tension reduction layer may be deposited between the conduction layer and the second dielectric layer. The tension layer reduces any stress due to different lattice constants between the conduction layer and the second dielectric layer, thereby increasing the freedom of choice for a suitable second dielectric layer material.

Some other embodiments related to the forming and depositing the second dielectric layer. The second dielectric layer can be formed by at least one of the following steps, including depositing a body layer, depositing a dielectric bonding layer between the conductive layer and the body layer and depositing a dielectric surface layer opposite the conductive layer. The body layer can act as a carrier layer sufficiently thick to provide the stability for subsequent processing or lift-off of the optoelectronic device. Different material can be used for the body layer. The dielectric layer on both sides may be used to electrically isolate the body layer from of the conductive layer or other processing layers.

In a further embodiment, one or more soldering layer bumps are deposited on each of the plurality of first contact via. The one or more soldering layer bumps can also be deposited on the at least one second contact via. They may extend at least partially the second electric layer. The extension of the soldering layer bumps onto the second electric player provides a larger area for soldering a second circuit to the two electronic devices. Potential mismatch issues are therefore reduced.

The first contact via in each area of the plurality of first areas in the first dielectric layer may comprise different shapes. A closed shape surrounds an area of the first dielectric layer. Such shape can be a rectangular shape, a rhombus shape, a parallelogram, a hexagon or any other convex polygon shape. The shape can be formed to provide a suitable current injection into a current distribution layer and the respective active region. In particular it is suitable to distribute the current over the full area of the active region. Likewise, the second contact via to the first dielectric layer and the active region can have similar shapes to inject the charge carriers into the semiconductor body and the active region.

In a similar manner, each of the insulation recesses within the conductive layer shape into a rectangular shape, a rhombus shape, a parallelogram or any other convex polygon shape. The shape of each insulation recess forms a closed surrounding defining one of the first area in the first dielectric layer and enclosing the first contact via.

In another embodiment, a surface of the semiconductor body opposite the first dielectric layer can be structured at least over a virtual extension of the plurality of first areas towards the surface of the semiconductor body. The structuring provides an improved decoupling of photons generated in the active region out of the semiconductor body. The structuring can be implemented by forming a dielectric layer having a substantially flat surface onto a roughened surface of the semiconductor body. In an aspect one or more structures on the surface of the semiconductor body can be provided. In an aspect one or more structures can be provided on the surface of the semiconductor. They can be arranged over a virtual extension of the second area to prevent optical crosstalk between adjacent first areas. The one or more structures can support the segmentation of the optoelectronic device. The structures are made of silicon or other suitable material. It may be possible to use the original carrier layer onto which the semiconductor body is formed. The one or more structures can also be used for supporting the optoelectronic device in subsequent processing steps.

BRIEF DESCRIPTION OF THE DRAWINGS

The present application is now explained in greater details with the port of the accompanying drawings, in which.

DETAILED DESCRIPTION OF ILLUSTRATIVE EMBODIMENTS

Optoelectronic devices are nowadays often segmented into several separated lighting devices, each of those being individually controllable. The segmentation enables different lighting structures, creating a variety of lighting effect and flexibility with respect to color or light strength. However, a segmented operation of a lighting device requires a power supply of the individual segments via respective individual contact. A common contact can be used for one terminal (most often the n-terminal) for each of the segments of the lighting devices. Other terminals (p-terminal contact) are then enabling addressing each segment of the lighting device individually.

Power supply for the individual segments can be established by a so called through silicon via (TSV), in which through via in a silicon carrier are used to contact the respective terminals onto a LED semiconductor 1 having the active and light emitting region. For such contact metallic solder material is used to contact-bond a carrier (for instance comprising silicon) to the LED semiconductor 1 to form the optoelectronic device. The TSV via in the carrier can then be contacted externally for connecting the optoelectronic device with control or driver circuitry. Soldering, however, has the risk of short-circuiting individual segments and is most often not used any longer. Instead, direct bonding methods are commonly used to connect the carrier to the LED semiconductor 1. However, direct bonding and subsequent processing of TSV's by etching the carrier can lead to delamination due to variances of the surface of the LED semiconductor 1. Larger LED semiconductor 1 areas with several segmentations may increase the problem due to the increased surface topology in the different conventional process steps of the LED semiconductor 1. As a result, the bond contacts are de-stabilized and TSV contacts may not work properly due to different etching depth. Hence, there is still room for improved optoelectronic devices.

The present application proposes the use of a single planar, conductive layer over an isolated active region of the semiconductor body. The conductive layer can act as a contact to the n-doped layer of the active region as well as (electrically isolated) a contact to the p-doped region. The planar deposition on a relatively large area provides a current distribution lowering local high current density, thereby reducing the thermal stress onto the device.

The metal layer has mirroring properties, thereby reflecting photons generated in the active region back towards the light emission side of the device. Finally, the metal layer provides a substantially flat surface over all segments of optoelectronic device allowing subsequent etching and bonding process steps.

Figure 1:
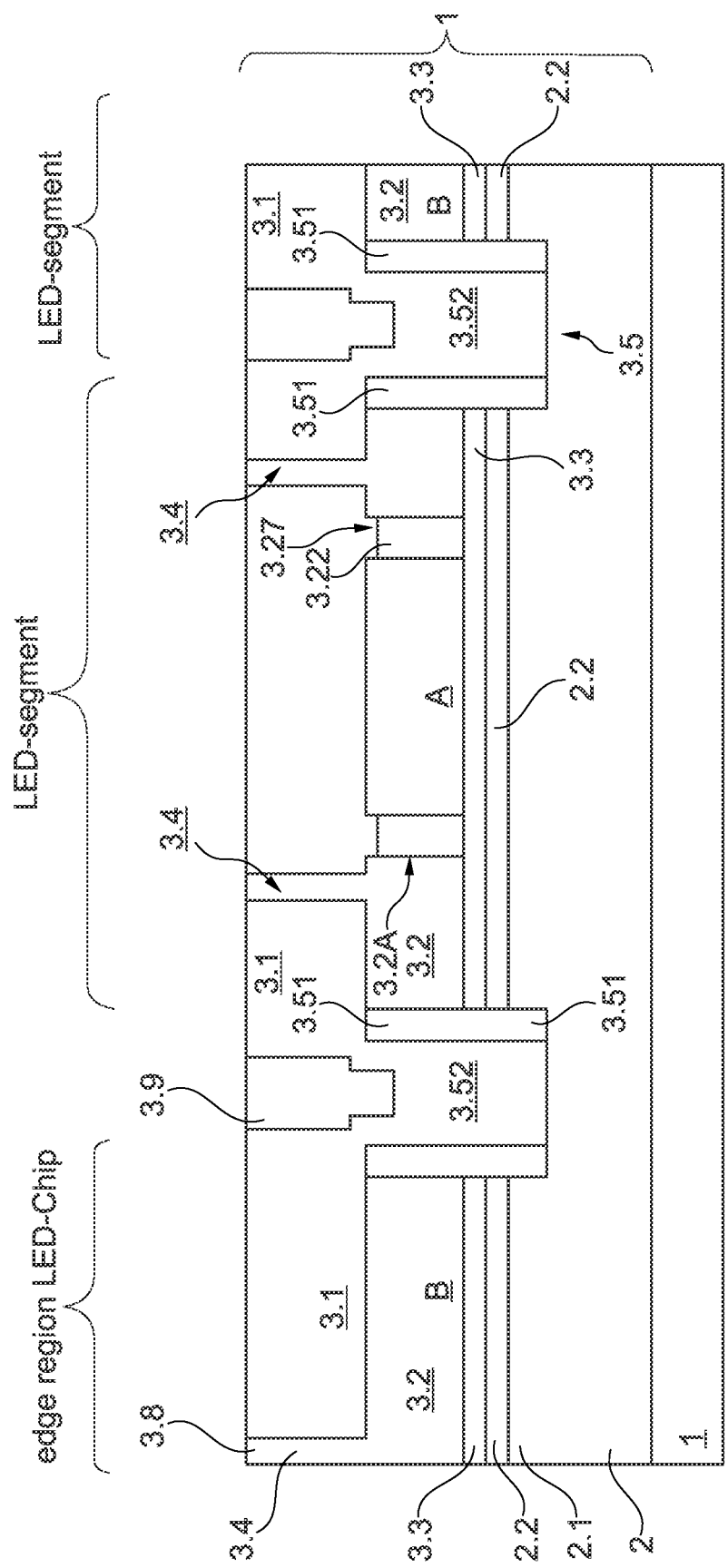
FIG. 1 illustrates some aspects of an embodiment of an optoelectronic device.

FIG. 1 illustrates some aspects of an embodiment according to the proposed principle. The embodiment shows a segment portion of a LED semiconductor 1. Various segments are arranged next to each other (not shown) and processed in various manufacturing steps.

The LED semiconductor 1 is arranged on a carrier layer 1. Such carrier layer can comprise sapphire, silicon, or any other suitable material upon which a semiconductor body can be deposited and grown. For simplicity purposes, semiconductor body 2 as shown herein only comprises a single layer. However, for compensation of lattice difference, tension or other stress between carrier layer 1 and semiconductor body 2, semiconductor body 2 can have a stacked layer structure compensating the lattice difference between carrier 1 and body 2. Semiconductor body 2 may comprise an III-V semiconductor material, like GaN, GaAS and the like.

Semiconductor body 2 comprises an active region, including an n-doped layer 2.1, upon which a p-doped layer 2.2 is deposited. Between the two differently doped layers 2.1 and 2.2 a pn-junction area is formed. Thickness of the doped region can vary and depends on various circumstances. For simplicity purposes semiconductor body 2 can be formed as an n-doped semiconductor. This may increase the conductivity in the material. A current distribution layer 3.3 is deposited upon the p-doped layer 2.2. Current distribution layer 3.3 may comprise a thickness in the range of a few tens of nanometers and distributes charge carrier into the p-doped region 2.2.

A dielectric layer 3.2 with a thickness up to 1 µm is deposited on top current distribution layer 3.3. The dielectric layer may comprise silicon oxide, aluminum oxide, Titan oxide, silicon nitride or any combination thereof. Other material combination may also be suitable and depend on the respective application. The various materials can be arranged as stacked or bulk layers. In the former case for instance, depositing Titan oxide and Silicon oxide as a stacked layer can act as a Bragg reflector system enabling to reflect photons generated in the active region between the p-doped layer 2.2 and n-doped layer 2.1 towards the decoupling region (surface of body 2 adjacent to carrier 1).

First dielectric layer 3.2 is preferably grown with a planar and flat surface extending over all (future) segments of the LED semiconductor 1. First dielectric layer 3.2 comprises a plurality of first areas A, of which one is shown and at least one second area B. Each area A together with an adjacent area B corresponds to a segment of the LED semiconductor 1.

Each of the areas A comprises a first via contact 3.2A extending from the upper surface of first dielectric layer 3.2 towards the current distribution layer 3.3. The contact via comprises a conductive material 3.22, for example, a metal. Material 3.22 is deposited in the layer to a level short below the surface of the first dielectric layer 3.2, thereby forming a small recess 3.27 as indicated.

Second area B of first dielectric layer 3.2 adjacent to area A and defined by the dotted line, as explained below also comprises a contact via 3.5. Contact via 3.5 extends from the upper surface of the first dielectric layer 3.2 through current distribution layer 3.3, the pn-junction into semiconductor body 2. The side-walls of contact via 3.5 are covered with a dielectric layer 3.51 and the layer is filled with a conductive material 3.52. Dielectric layer 3.51 can be Silicon oxide, for example; the conductive material can comprise a metal. Hence, in such arrangement, first contact via 3.2A electrically contacts the p-doped layer of the optoelectronic device while contact via 3.5 contacts the n-doped region. To prevent short circuitry between p-doped regions of different segments of the LED semiconductor 1, the contact via 3.5 may surround area A.

Upon the surface of the first dielectric layer 3.2 a planar metal layer 3.1 is formed. As illustrated in FIG. 1, metal layer 3.1 extends partly into the recesses of first contact via 3.2A filling them completely. First metal layer 3.1 also contacts the conductive material 3.52 and the second contact via 3.5. During the deposition of metal layer 3.1 one or more artificial and undesired recesses over second contact via 3.5 may remain, which are subsequently filled with filling material 3.9 to form a planar surface on the top of metal layer 3.1.

For electrical separation metal layer 3.1 also comprises an insulation recess filled with the electric material 3.4. The insulation recess 3.4 filled with the dielectric material forms an enclosed surrounding, thereby defining areas A and B, by separating the metal layer material contacting the first contact via 3.2A from the metal layer material contacting the second contact via 3.5. in other words, the virtual extension of the recesses 3.4 into the dielectric material, illustrated in FIG. 1 by the dotted line, separates these first dielectric layer 3.2 into an area A and an area B. Area A and B allow segmenting the optoelectronic device.

As a result, conductive material layer 3.1 contacts both the n-doped and the p-doped segmented portions of the semiconductor body while maintaining a flat and equal surface. Such structure therefore provides more simplified further processing steps. In particular, a direct bonding of the LED semiconductor 1 to a carrier or another device becomes possible with a significantly reduced risk that the topology of an uneven surface of metal layer 3.1 causes delamination or faulty connections during the TSV process.

Figure 2:
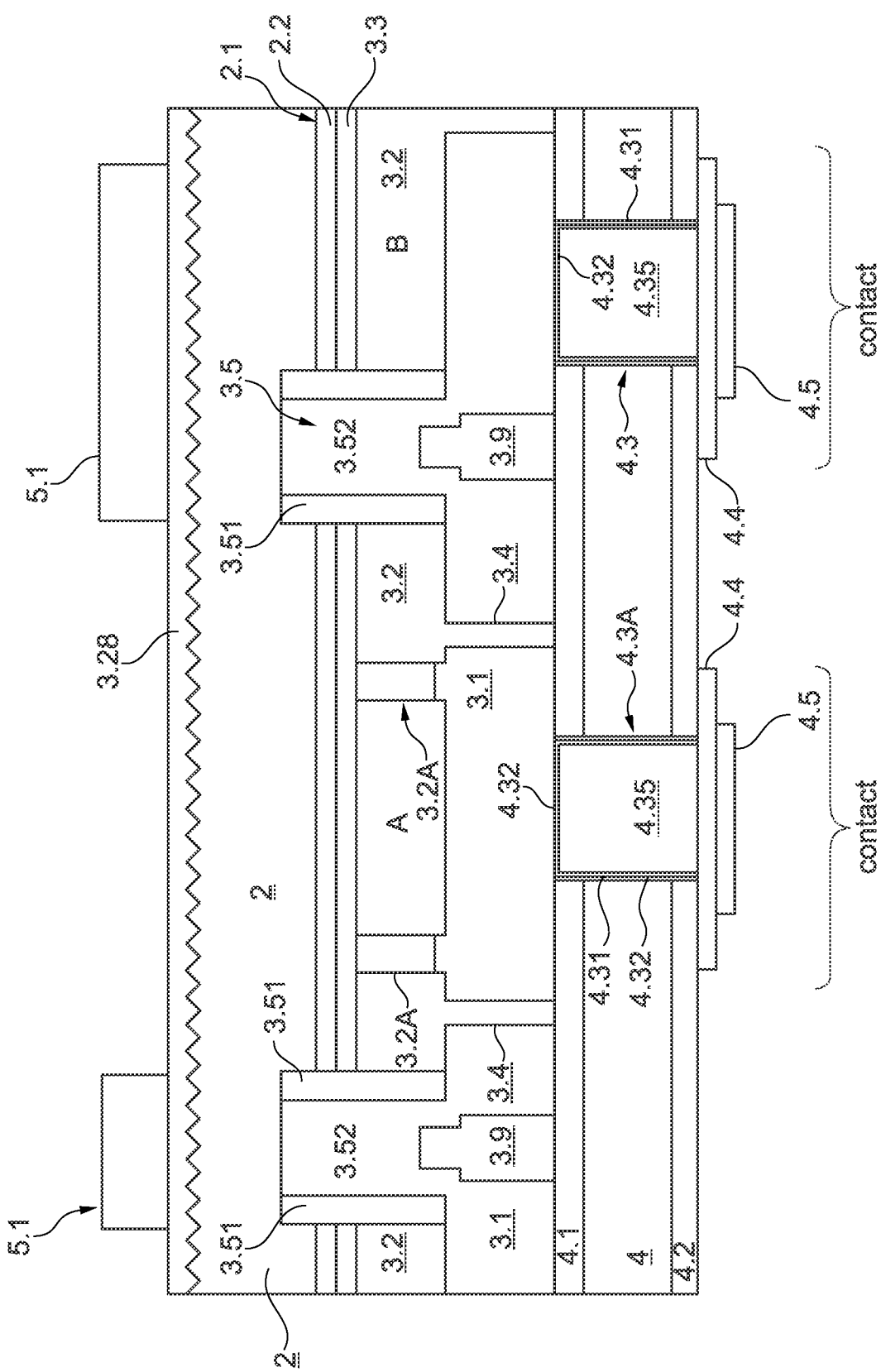
FIG. 2 shows additional aspects of the proposed principle.

FIG. 2 illustrates further aspects of the processing of and optoelectronic device in accordance with the proposed principle.

As shown here, the optoelectronic device is turned upside down where for further processing. The upper surface of the semiconductor body 2 of the LED semiconductor 1, that is opposite the active region is structured to enable an improved photon transmissions of photons generated in the active region of semiconductor body 2.

For this purpose, the upper surface of semiconductor body 2 is roughened or structured in a different way and subsequently oxidized to form a thin structured layer 3.28 surface. The structure under the upper surface extends all across area A of the first dielectric layer as indicated and partly through area B. In this extension area most photons are generated during operation of the optoelectronic device. To guide transmitted light as well as preventing an optical cross talk between the different segments a the LED semiconductor 1 and the optoelectronic device, further structures 5.1 arranged on the surface of dielectric structured layer 3.28. These structures can for instance comprise silicon layer or a metal mirror layer. In this regard, it might be useful to use structure 5.1, as an auxiliary carrier throughout the processing of the device. For example, carrier one is shown in FIG. 1 might be suitable for this purpose. Alternatively, carrier one can be removed during processing of the optoelectronic device and the additional layers 5.1 can be structured and arranged on dielectric layer 3.28.

The planar and flat surface of conductive layer 3.1 in its first and second regions enable bonding to a silicon carrier 4 using direct bonding techniques. The dielectric layer 4.1 of carrier layer can be polished and comprises a roughness of less than 1 nm. Both planar surfaces of dielectric layer 4.1 and conductive layer 3.1 are rigidly bonded directly to each other, resulting in large bonding area. Unintended delamination during subsequent processing steps or due to thermal stress during operation of the optoelectronic device is therefore reduced. Silicon layer 4 provides stability for the LED semiconductor 1 due to its larger thickness of several µm, for instance in the range of 80 mµ to 120 mµ.

Silicon carrier 4 comprises the first dielectric layer 4.1 and on its opposite side a second dielectric layer 4.2. Both dielectric layers are made of silicon oxide. In addition, the silicon layer includes contact via 4.3A and 4.3, respectively. Each contact via extends from the surface of the electric layer 4.2 through the silicon material of carrier 4 to dielectric layer 4.1, and there contact conductive layer 3.1 of the LED semiconductor 1. Each of the contact via comprise a sidewall having a dielectric material 4.31 deposited on it as well as a conducting layer 4.32 extending from the respective sidewalls towards the metal layer surface. Dielectric layer 4.31 may comprise silicon oxide, for example, while conducting layer 4.32 consists of a metal compound in this example, for instance TaCu or another compound containing Cu. The material of conducting layer 4.32 is selected such that it provides a good contact to the material of conductive layer 3.1 reducing the risk of delamination. Via 4.3A and 4.3 are then filled with conductive material 4.35, e.g., a metal. Any current injected through contact via 4.3A and 4.3 is distributed across a larger area in conductive layer 3.1 reducing the thermal stress.

Contact via 4.3A is arranged such that it contacts conductive layer 3.1, such that it provides an electrical contact to via 3.2A in the first area A. Even more specifically, contact via 4.3A is arranged such that it is not directly above contact via 3.2A in area A, but slightly displaced of them. In other words, contact via 4.3A does not cross a virtual extension of contact via 3.2A in the first dielectric layer towards the silicon carrier. Due to the displacement and the specific location of contact via 4.3A and via 3.2A, delamination of the contact via is further reduced. As the contact between the metal layer 3.1 and the material in contact via 4.3A is displaced with respect to contact via 3.2A, any roughness in the surface of metal layer 3.1 due to the growth process and caused by via 3.2A is not affecting the contact between metal layer 3.1 and contact via 4.3A. In addition, the relatively large area of conductive material layer 3.1 defining areas A and B allow for a small misalignment during the direct bonding process, without causing short circuit or other electrical contact problems.

Likewise contact via 4.3 is arranged over area B at a location displaced from a virtual extension of contact via 3.5. As illustrated in FIG. 2, roughness or uneven surface in conductive layer 3.1 caused by the growth process that during manufacturing does not affect the contact between via 4.3 and metal layer 3.1 in region B. Such displacement of the contact via enable simultaneously contacting the p- and n-doped layers of the semiconductor body through the silicon carrier 4 and metal layer 3.1.

On the surface of the dielectric layer 4.2 a contact pad is arranged. The contact pad comprises the first metal bump 4.4 arranged over the respective via contacts and a soldering bump 4.5 arranged on first metal bump 4.4. Both bumps are arranged over the contact via but can also extend partly over the dielectric layer 4.2. First metal bump 4.4 is selected from a group of material, which provides a rigid connection to layer 4.2 reducing delamination. It can be the same material as layer 4.32 in the via 4.3A and 4.3. The arrangement increases the size of the soldering contacts for a more simplified subsequent processing reducing misalignment issues.

Figure 3:
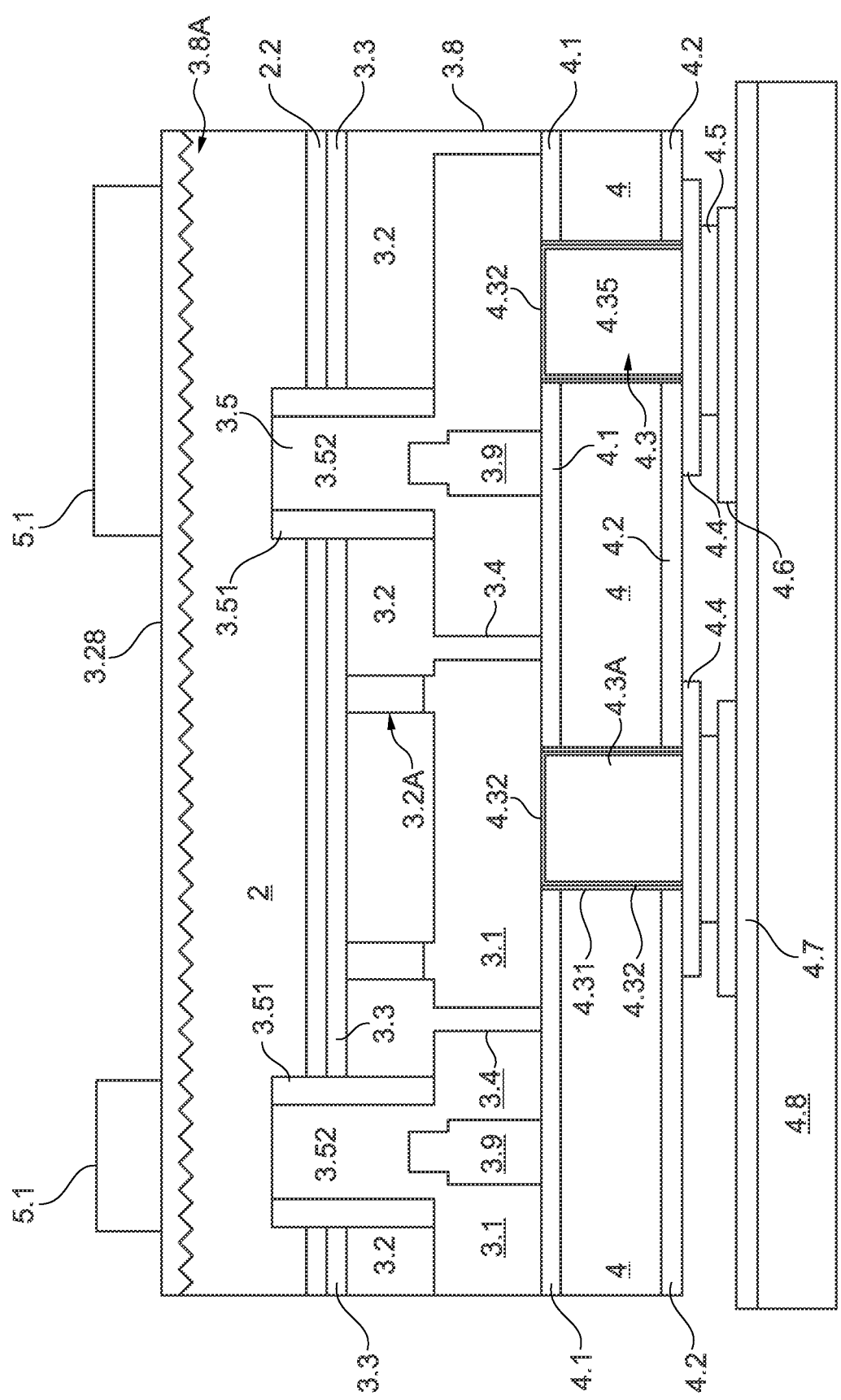
FIG. 3 shows some further aspects of an embodiment of an optoelectronic device.

FIG. 3 illustrates an application of the optoelectronic device connected to a respective control circuitry. The control circuitry 4.8 indicated by semiconductor material is in contact with the optoelectronic devices via the soldering bumps 4.4, 4.5, and 4.6, respectively. For such purpose, control circuitry 4.8 having one or more metallization and dielectric layers 4.7 on its surface is arranged with its soldering bumps layers 4.6 opposite the respective contact portions on the surface of dielectric layer 4.2 of the optoelectronic device. Both chips are then be soldered together.

Figure 4:
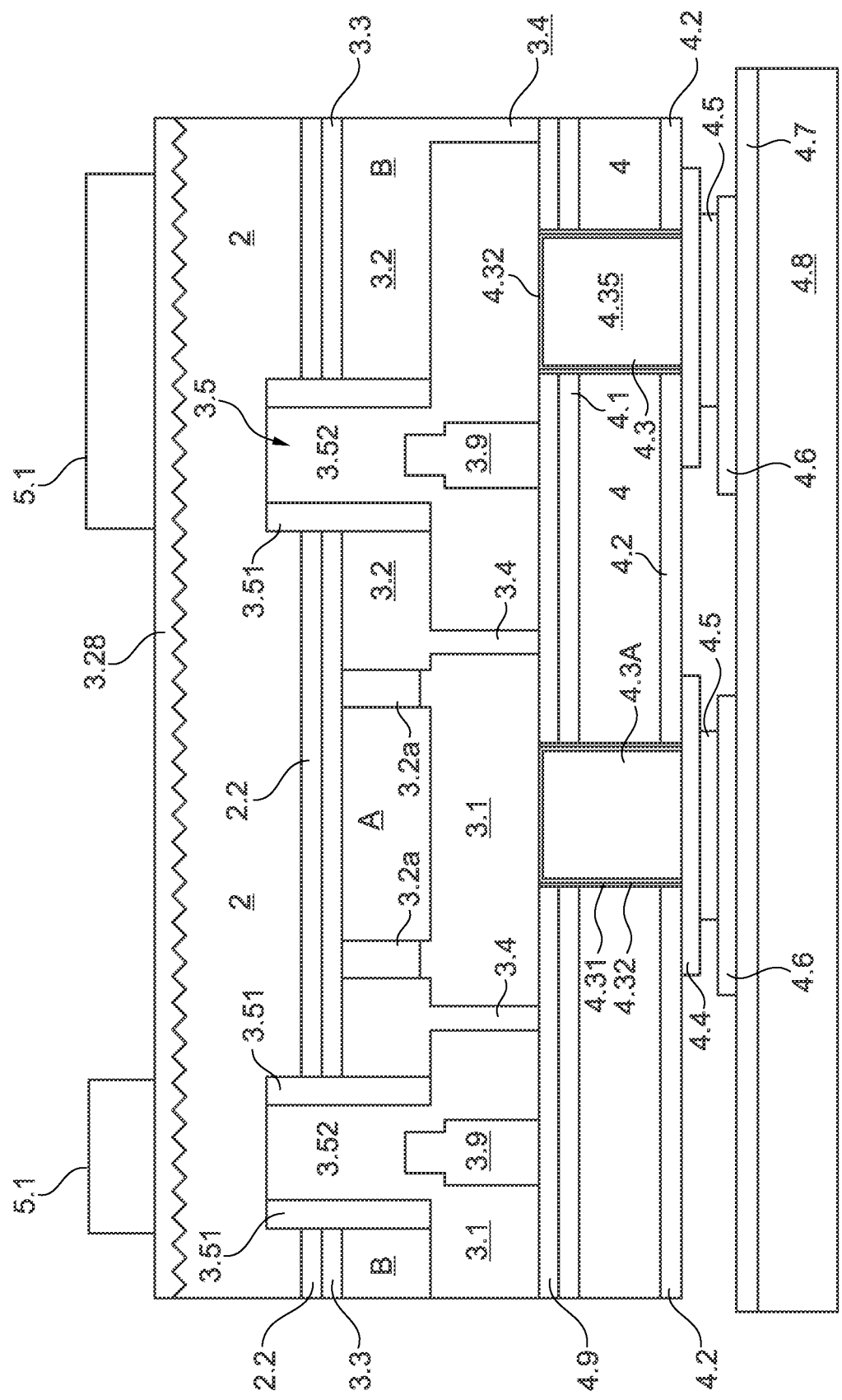
FIG. 4 shows yet another embodiment of the proposed principle.

FIG. 4 illustrates an alternative embodiment of an optoelectronic device. In this embodiment, care is taken on the fact that the LED semiconductor 1 including its conductive layer 3.1 may comprise a different lattice distance or crystal structure compared to the dielectric layer 4.1 or carrier 4. Direct bonding of the LED semiconductor 1 and the silicon carrier 4 may result in lattice tension on the respective border and into the LED semiconductor 1. Such tension can increase the risk of delamination or failure in the contacts on the contact via 4.3 and 4.3A. To reduce the tension, an additional compensation layer 4.9 can be arranged between the metallization 3.1 and the silicon carrier 4.

FIGS. 5A to 5G show various processing steps of a portion of an optoelectronic device in accordance with the proposed principle. Although, the processing of only a single segment is shown, the described manufacturing steps can be performed for larger areas to provide various segments of an LED semiconductor 1.

Figure 5A:
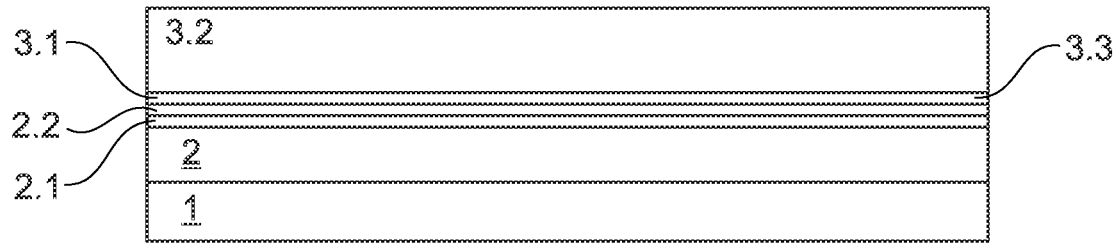
FIG. 5A to 5G illustrates various manufacturing steps of an optoelectronic device according to an embodiment.

In FIG. 5A, carrier layer 1 is provided, on which a semiconductor material 2 is deposited. Carrier layer 1 can comprise silicon, sapphire or any other suitable material. To compensate a potential lattice difference and tension between semiconductor body 2 and carrier layer 1, one or more compensation layers can be arranged. Semiconductor body 2 can comprise an undoped material, but is often n-doped to reduce its specific resistance. The material may be a III-V semiconductor compound, for example, GaN, AlGaN, GaAs, AlGaAs, GaP or any other suitable III-V semiconductor compound. The same technology and processing steps can also be used of an IV semiconductor or II-VI material. The semiconductor material physically deposited, chemically deposited or provided in any other suitable manner. Typical deposition techniques for these and the other processing steps include CVD, MOCVD, MBE and the like. On the surface of body 2 an n-doped layer 2.1 is arranged. Then, a p-doped layer 2.2 is arranged. Both layers can be deposited using one of the techniques above. Alternatively, ion implantation techniques can be used. In an embodiment semiconductor body 2 is already n-doped, so only a p-doped layer has to be arranged on the surface. In this regard, the junction between the p-doped layer 2.2 and the n-doped layer 2.1 forms the depletion zone, in which the charge carriers are combined under emission of radiation.

A current distribution layer 3.3 is subsequently arranged on layer 2.2. Current distribution layer 3.3 can comprise ITO or any other suitable material having a relatively small specific resistance. Upon the current distribution layer 3.3, the first dielectric layer 3.2 is deposited. Such dielectric layer can for instance comprise silicon oxide, silicon nitride or another suitable material. The thickness of the dielectric layer can vary between a couple of hundred nanometers to 1 μm.

As in operation of the electronic device, the photons are created in the pn-junction between layer 2.2 and 2.1, first dielectric layer 3.2 can also act as a mirror or mirroring layer, reflecting the photons back towards semiconductor body 2. To facilitate and improve the reflection, the first dielectric layer 3.2 may also comprise a stacked layer arrangement, for instance comprising Titan oxide as a Bragg reflector. In this regard, several very thin layers of Titan oxide and Titan nitride may be arranged as a stacked layer (not shown in FIG. 5A).

Figure 5B:
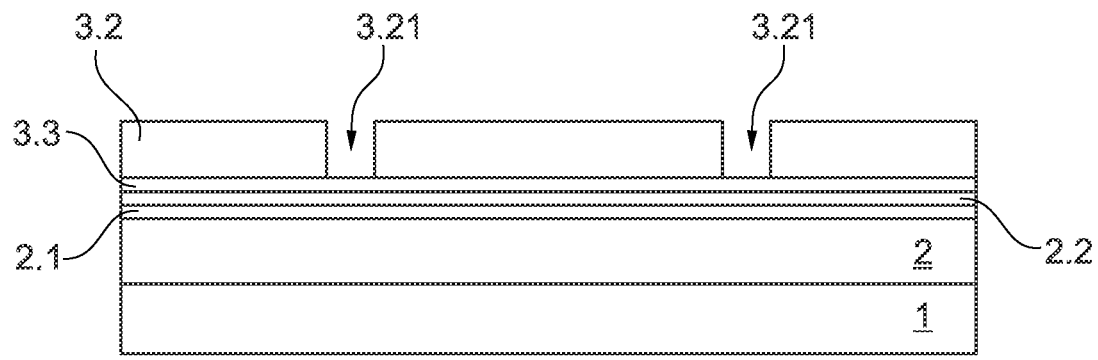
Figure 5C:
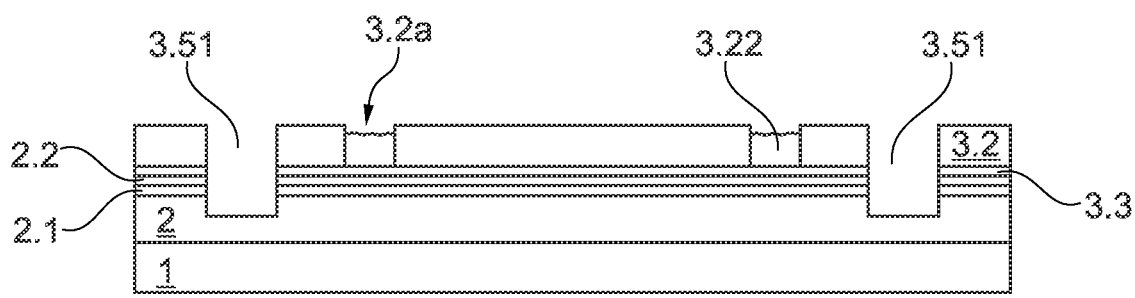

FIG. 5B illustrates a next processing step. On top of the first dielectric layer 3.2, a photo resist is deposited and illuminated. The photoresist is removed in illuminated areas exposing the surface of dielectric layer again, which is subsequently etched till the current distribution layer 3.3 is reached to form first contact recesses 3.21. As shown in FIG. 5C, the recessed areas are then filled with a conductive material 3.22, for instance metal and the like. The remaining non illuminated photoresist with the conductive material on top is removed, leaving the filled recesses. Material 3.22 is filled into recess until close to the upper surface of the electric layer 3.2. Alternatively some of the material can be removed, e.g., during removal process of the photoresist. As a result, recess 3.2A forms a contact via, but still comprises a small recess compared to the upper surface of dielectric via 3.2 as illustrated in FIG. 5C. Such small recess has the benefit that in the subsequent steps, particularly when a metallization layer is deposited, these areas do not cause bumps or protruding areas of the upper surface of the metallization layer. In other words, the remaining recess in via 3.2A prevents a protrusion on the upper surface of the metallization layer arranged thereupon.

After removal of the photoresist, another layer of photoresist is deposited and illuminated. The illuminated areas are removed, and second recesses 3.51 are etched through the dielectric layer 3.2, the current distribution layer 3.3 and the pn-junction into semiconductor body 2. These steps can also be performed together with some of the preceding steps.

Figure 5D:
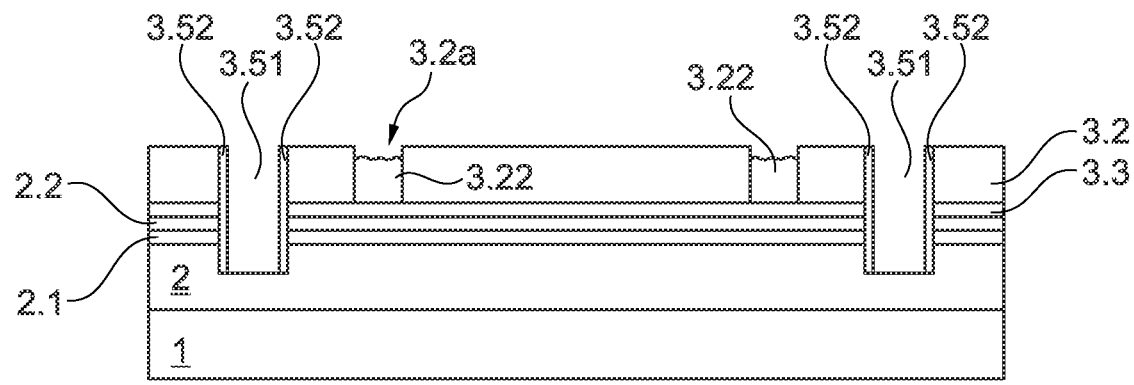

FIG. 5D shows the processing step in which the sidewalls of recesses 3.51 are isolated, that is a dielectric layer 3.51 is formed on the sidewalls. Dielectric layer 3.51 can comprise silicon oxide. Thus, a short circuit into the active area of semiconductor body 2 is prevented.

Figure 5E:
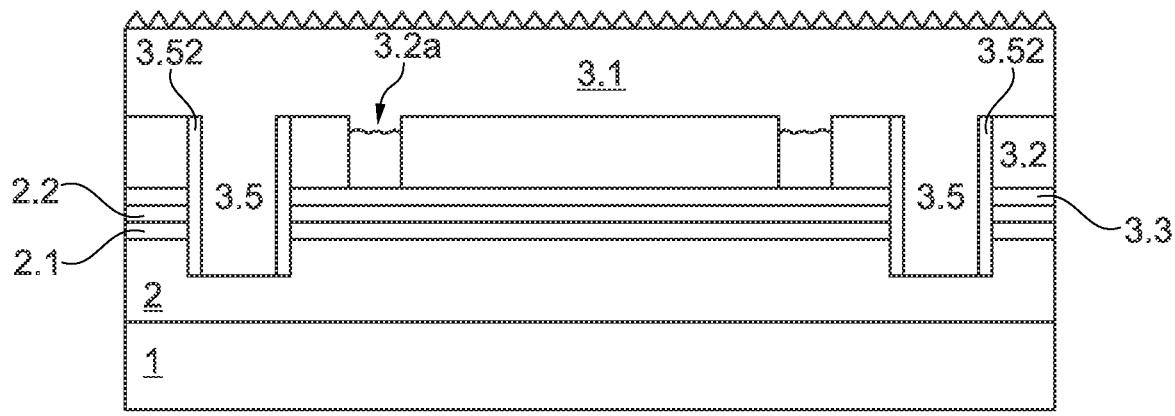

In FIG. 5E, the photoresist to form via 3.5 is removed, and via 3.51 is filled with a conductive material, for example, a metal. The conductive material is also deposited on the surface of the first dielectric layer forming conductive layer 3.1. As illustrated, metallization layer 3.1 now contacts the p-doped layer 2.2 of semiconductor body 2 by contact via 3.2A and the n-doped layer 2.1 of semiconductor body 2 via the previously formed contact via 3.5.

Figure 5F:
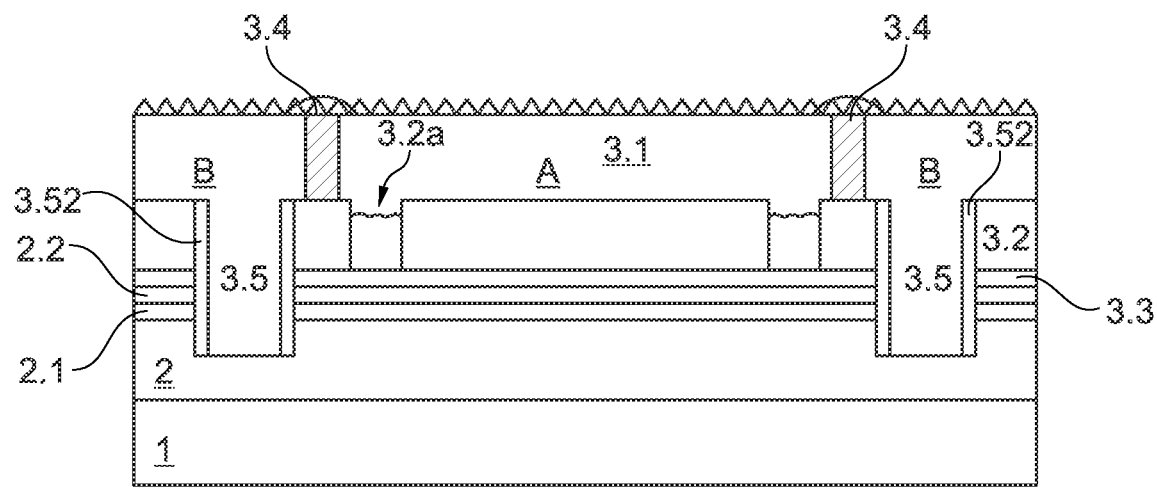
Figure 5G:
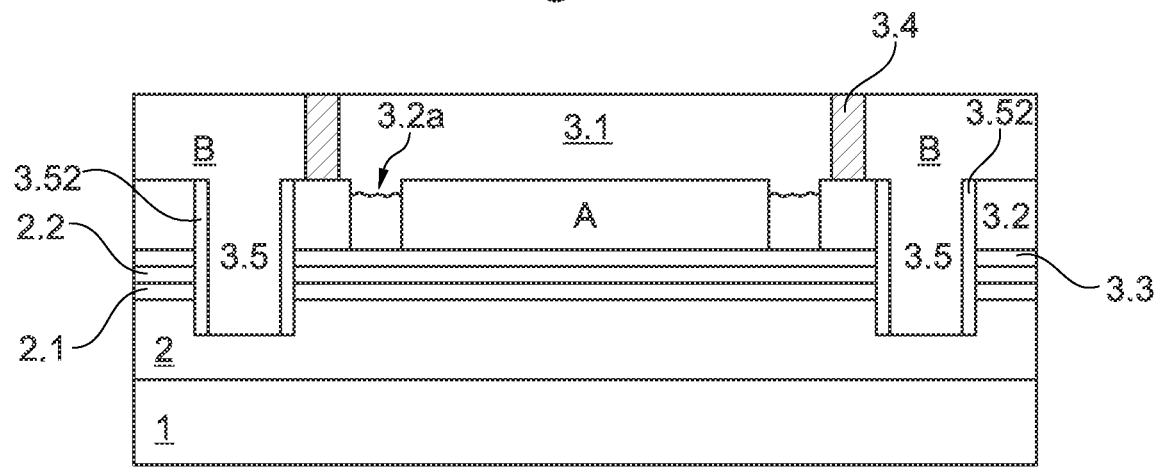

In a subsequent processing step shown in FIG. 5F, regions A and B for contacting the respective p-doped and n-doped layer into semiconductor body are defined. For this purpose, a photoresist is deposited on conductive layer 3.1 and illuminated. After removal of the illuminated photoresist areas, the conductive area 3.1 is etched in these areas down to the first dielectric layer 3.2. The recess forms a closed space surrounding an area, thereby defining region A of the conductive layer 3.1 as well as the region B. The recess is filled with a dielectric material 3.4 to electrically isolate region A of the conductive layer from region B. Among others, the processing steps conducted in FIGS. 5E and 5F can cause an uneven and a rough surface. For example, the conductive material may not evenly be grown on the surface of dielectric layer 3.2. Hence, conductive layer 3.1 and dielectric material in insulation recess 3.4 are polished and removed providing a planar and flat surface that extends over several different segments of the LED semiconductor 1.

Dielectric material 3.4 in the recesses of conductive layer 3.1 defining the areas A and B surrounds the material inside area A completely and isolates it from region B. A plurality of such insulation recesses therefore form a plurality of individual areas A, contacting the p-doped layer and a single area B contacting the n-doped layer. Depending on the respective application, Areas A and B can have various sizes and/or shapes.

Figure 6:
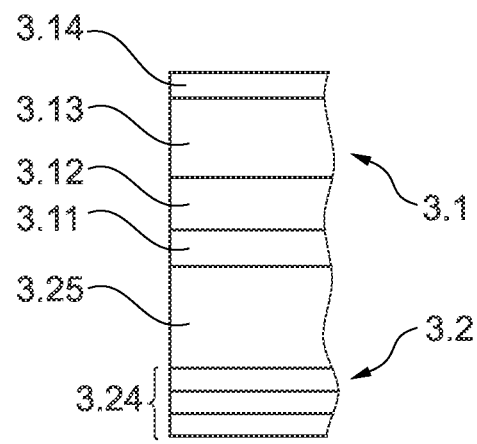
FIG. 6 shows a detailed view of several layers of an optoelectronic device.

FIG. 6 illustrate an alternative embodiment for the first dielectric layer 3.2 and the conductive layer 3.1. Both layers are implemented as stacked layers. Conductive layer 3.1 comprises several different layers of metal compounds to provide a good adhesion on the first dielectric layer, sufficient current distribution and good contact on the top surface for the direct bonding. Layer 3.11 comprises ITO having a good adhesion to silicon oxide of the first dielectric layer. Layers 3.12 and 3.13 include a metal compound for instance AL, Au, Cu or Ag to achieve a sufficient current distribution. Titan or a similar material can be used on the surface for direct bonding. Likewise first dielectric layer can comprise various individual layers. While 3.35 may comprise silicon oxide, stacked structure 3.24 may act as a Bragg reflector, using $Al_2O_3$, SiN, $SiO_2$ or $TiO_2$.

Figure 7:
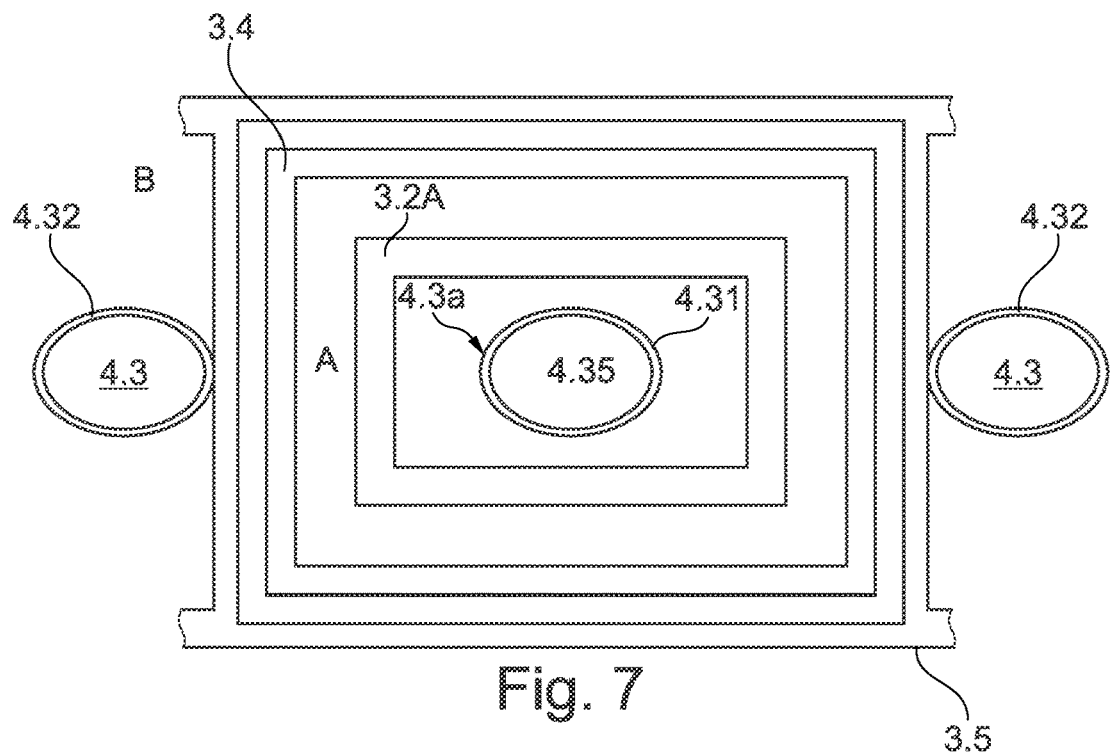
FIG. 7 illustrates a top view showing some features of an embodiment of an optoelectronic device.

FIG. 7 in this regard shows a top view of an optoelectronic device and more particular an LED semiconductor 1 to illustrate the segmentation of the various recesses filled with dielectric material. The "center" of FIG. 7 comprises contact via 4.3A contacting the p-doped layer of the optoelectronic device. Contact via 4.3A is displaced with respect to contact via 3.2A, the latter being arranged in the first dielectric layer, connecting the conductive layer 3.1 through the first dielectric layer to the p-doped portion of the pn-junction. Charge carriers are therefore flowing through contact via 4.3A and then through the conductive layer distributing the current throughout the rectangular shape of via 3.2A. As a result, the current density is reduced through the relatively small contact via 4.3A and the conductive material 3.1 and the first contact via 3.2A to the p-doped semiconductor layer.

To prevent a short circuit between the different polarities, conductive material 3.1 comprises isolation recesses 3.4 surrounding contact via 4.3A and rectangular contact via 3.2A thereby forming region A of conductive layer 3.1. The dielectric material of the insulation recesses 3.4 also isolates region A from region B in the conductive layer. Region B in the conductive layer connects the n-doped layer 2.1 of the LED semiconductor 1 via contact via 3.5 to the contact 4.3. As shown contact 3.5 is also formed as recess with a surrounding shape to achieve the segmentation. The p-doped layer has to be segmented in a similar way to prevent current in the p-doped layer of one segment to flow to the p-doped layer of another segment. Through this segmentation, a plurality of contacts via 4.3A contact respective segmented p-doped in the LED semiconductor 1. A single n contact may be enough to connect all n-doped portions of the junction. Hence, for segmentation X of an optoelectronic device according to the proposed principle, one may need X contacts for the p-region and a single contact for the n region.

Figure 8:
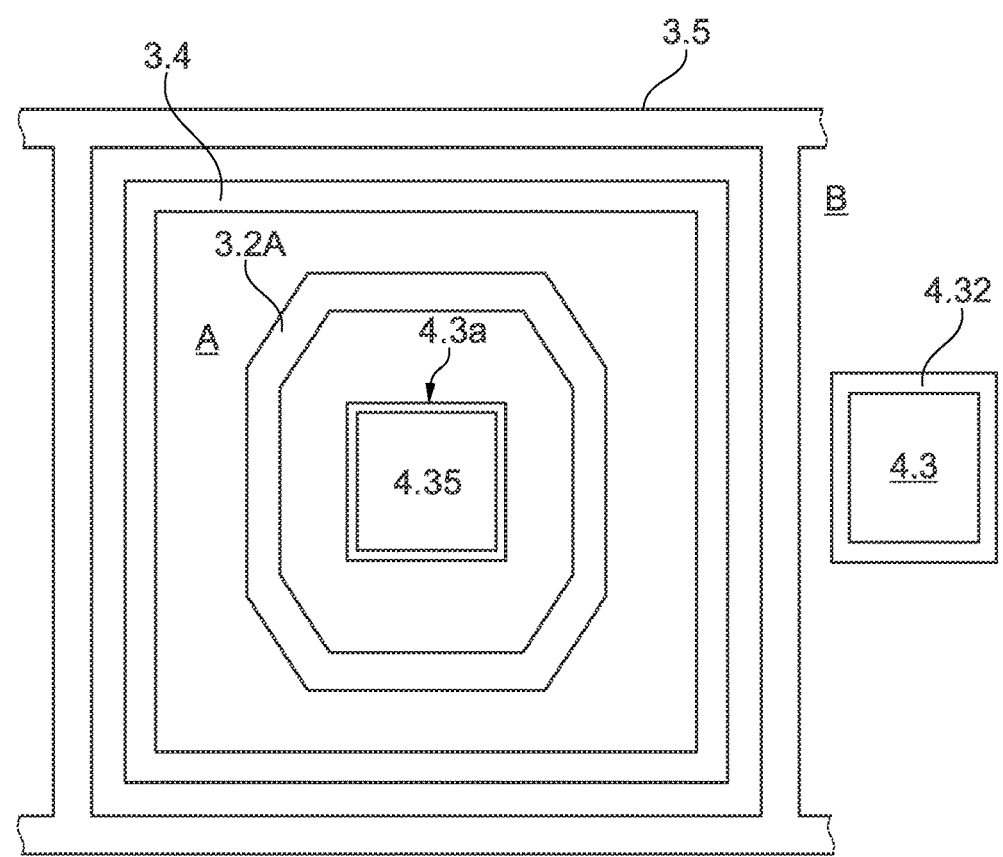
FIG. 8 shows another top you illustrating an alternative embodiment.

The segmentation according to FIG. 7 can be different and adapted to the respective applications needs and requirements for the optoelectronic device. FIG. 8 shows another exemplary embodiment with different shaped structures. Contacts via 4.3, as well as contact via 4.3A are structured with rectangular shapes. Depending on the required current distribution, first contact via 3.2A is structured with a hexagonal form. As in the embodiment of FIG. 7 first contact 3.2A surrounds contact via 4.3A to improve the current distribution. Contact via 4.3A is displaced with respect to via 3.2A and not overlaying via 3.2A, thus reducing the risk of delamination of the contact via. Isolation recess 3.4 separates and segments the conductive material layer 3.1.

Figure 9A:
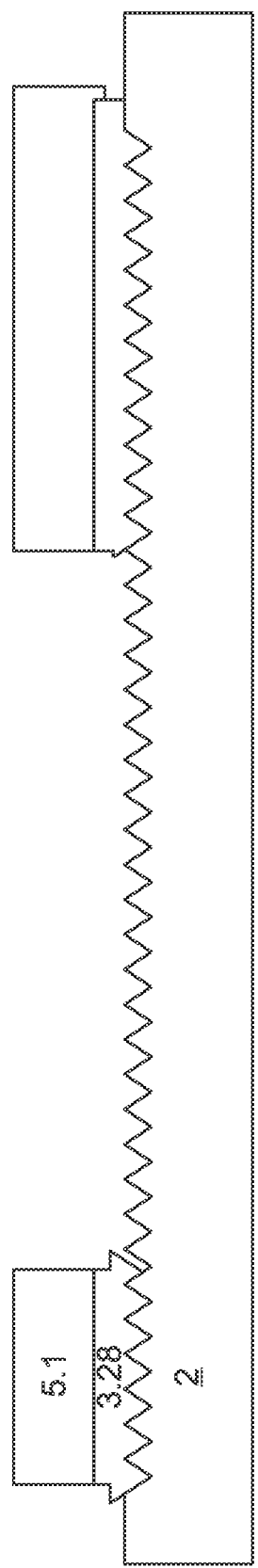
FIG. 9A shows parts of an embodiment of a optoelectronic device focusing on the light emission area.
Figure 9B:
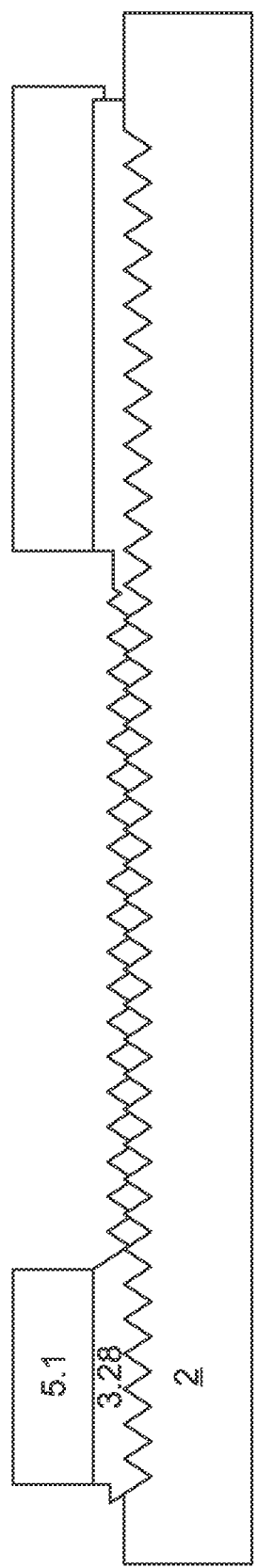
FIG. 9B shows parts of another embodiment of an optoelectronic device focusing on the light emission area.

FIGS. 9A and 9B illustrate parts of an optoelectronic device according to some embodiments of the present invention. The semiconductor body 2 is structured and roughened on the surface opposite a virtual extension of area A, that is the light emission area. As such light being generated by the recombination of electrons and hole in the pn-junction adjacent to area A is coupled out of semiconductor body 2 via the roughened surface. Adjacent to the roughened surface, the dielectric layer 3.28 is deposited having itself a flat surface. Direct or metal bonding is performed to form material 5.1 on top of dielectric layer 3.28. Alternatively and as shown in FIG. 9B, for example, the dielectric layer 3.28 can be deposited over the full span and structured or roughened in the area opposite a virtual extension of area A. This may even further improve the optical behavior as the difference in the refraction index between the material towards air can be further reduced. In addition structuring may be simplified, because material 5.1. can act as a natural barrier.

What is claimed is:

1. An optoelectronic device comprising:
   a semiconductor body comprising a layer sequence with an active region configured to generate radiation;
   a first dielectric layer arranged on the layer sequence having a plurality of first areas and a second area;
   a first contact via in each area of the plurality of first areas for contacting a first side of the active region;
   a second contact via in the second area for contacting a second side of the active region; and
   a conductive layer comprising a plurality of first regions and a second region surrounding the plurality of first regions and electrically isolated from the plurality of first regions,
   wherein the conductive layer has a substantially planar surface and is arranged planar onto the plurality of first areas and the second area such that each of the plurality of first regions of the conductive layer is in contact with a respective first contact via in a respective first area of the plurality of first areas and the second region of the conductive layer is in contact with the second contact via, and
   wherein a conductive material in the first contact via is recessed such that the conductive layer extends partly into the first contact via.

2. The optoelectronic device according to claim 1, further comprising:
   a second dielectric layer arranged planar onto the conductive layer and comprising a plurality of third contact vias,
   wherein each third contact via of the plurality of third contact vias contacts a corresponding first region of the conductive layer such that each third contact via is displaced with respect to a virtual extension of the first contact via in each area of the plurality of first areas.

3. The optoelectronic device according to claim 2, further comprising a fourth contact via in the second dielectric layer contacting the second region of the conductive layer such that the fourth contact via is displaced with respect to a virtual extension of the second contact via in the second area.

4. The optoelectronic device according to claim 2, wherein the second dielectric layer comprises at least one of the following: a body layer, a dielectric bonding layer between the conductive layer and the body layer, or a dielectric surface layer opposite the conductive layer.

5. The optoelectronic device according to claim 2, further comprising one or more soldering layer bumps arranged on each of the plurality of first contact vias and/or on the second contact via and extending at least partly onto the second dielectric layer.

6. The optoelectronic device according to claim 2, wherein the plurality of third contact vias and a fourth contact via in the second dielectric layer comprise a dielectric layer arranged on their sidewalls and a conducting layer on the dielectric layer, the conducting layer contacting the conductive layer.

7. The optoelectronic device according to claim 1, wherein the conductive material in the first contact via is different from a material of the conductive layer.

8. The optoelectronic device according to claim 1, wherein the first contact via in each area of the plurality of first areas, and/or the second contact via comprises at least one of: a closed shape, a rectangular shape, a rhombus shape, a parallelogram shape, or a hexagon or another convex polygon shape.

9. The optoelectronic device according to claim 1, wherein the conductive layer comprises a dielectric area electrically isolating the first regions and the second region and extending from the first dielectric layer to an upper surface of the conductive layer.

10. The optoelectronic device according to claim 1, wherein the second contact via in the second area extends through the layer sequence and comprises a dielectric layer arranged on its sidewall.

11. The optoelectronic device according to claim 1, wherein the layer sequence comprises a current distribution layer being in contact with the first contact via of a respective one of the plurality of first areas.

12. The optoelectronic device according to claim 2, further comprising a tension reduction layer arranged between the conductive layer and the second dielectric layer.

13. The optoelectronic device according to claim 1, further comprising a structuring on an emission surface of the semiconductor body, wherein the structuring is arranged at least over a virtual extension of the plurality of first areas towards the surface of the semiconductor body, and wherein the structuring has a substantially flat surface.

14. The optoelectronic device according to claim 1, further comprising one or more structures on a surface of the semiconductor body and/or a structuring, wherein the one or more structures is arranged over a virtual extension of the second area to prevent optical crosstalk between adjacent first areas.

15. The optoelectronic device according to claim 1, further comprising a filling material in areas of the conductive layer over the second contact via such that the conductive layer with the filling material forms a planar and substantially flat surface.

* * * * *